United States Patent
Birner et al.

(10) Patent No.: US 7,385,256 B2
(45) Date of Patent: Jun. 10, 2008

(54) TRANSISTOR ARRANGEMENT IN MONOCRYSTALLINE SUBSTRATE HAVING STRESS EXERTING INSULATORS

(75) Inventors: Albert Birner, Dresden (DE); Matthias Goldbach, Dresden (DE)

(73) Assignee: Infineont Technologies AG, Munich (DE)

( * ) Notice: Subject to any disclaimer, the term of this patent is extended or adjusted under 35 U.S.C. 154(b) by 122 days.

(21) Appl. No.: 11/131,938

(22) Filed: May 17, 2005

(65) Prior Publication Data
US 2005/0285150 A1 Dec. 29, 2005

(30) Foreign Application Priority Data
May 17, 2004 (DE) ............ 10 2004 024 783
Feb. 4, 2005 (DE) ............ 10 2005 005 327

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. ............ 257/369; 257/374; 257/510; 257/E27.6; 257/E27.062

(58) Field of Classification Search ........ 257/368–369, 257/374, 397, 501, 510, E27.06, E27.062
See application file for complete search history.

(56) References Cited

U.S. PATENT DOCUMENTS 4,548,658 A 10/1985 Cook
5,534,713 A 7/1996 Ismail et al.
5,913,125 A 6/1999 Brouillette et al.
6,191,002 B1 2/2001 Koyanagi
6,682,965 B1 1/2004 Noguchi et al.
6,717,213 B2 4/2004 Doyle et al.
2003/0021971 A1 1/2003 Zheng (Continued)

FOREIGN PATENT DOCUMENTS

JP 08130199 A 5/1996

(Continued)

OTHER PUBLICATIONS

Sze, S.M. *Physics of Semiconductor Devices*. 2nd Edition. New York: Wiley-Interscience Publication, 1981. pp. 446-448 (5 Pages).

Primary Examiner—Hoai v Pham
(74) Attorney, Agent, or Firm—Maginot, Moore & Beck

(57) ABSTRACT

In order to insulate active areas of n-type FETs and p-type FETs, insulator structures which due to production exert a tensile stress or a compressive stress on the respectively neighboring active areas, and which stress them accordingly, are provided in the semiconductor substrate in addition to the active areas formed by sections of a semiconductor substrate. The insulator structures are respectively established on a base section by which a tensile stress is induced in adjacent active areas. Insulator structures respectively next to a p-type FET are selectively provided with additional buffer layers by which, due to production, a compressive stress is induced in adjacent structures. The charge carrier mobility is increased both for electrons I n the channel regions of the n-type FETs and for holes in the channel regions of the p-type FETs, and the functionality is improved both for the n-type FETs and for the p-type FETs.

12 Claims, 11 Drawing Sheets

U.S. PATENT DOCUMENTS

| | | |
|---|---|---|
| 2003/0040158 A1 | 2/2003 | Saitoh |
| 2004/0063300 A1 | 4/2004 | Chi |
| 2004/0075148 A1 | 4/2004 | Kumagai et al. |
| 2004/0212035 A1* | 10/2004 | Yeo et al. .................. 257/510 |
| 2004/0217448 A1 | 11/2004 | Kumagai et al. |
| 2005/0032275 A1 | 2/2005 | Toda et al. |
| 2005/0121727 A1 | 6/2005 | Ishitsuka et al. |
| 2005/0255667 A1* | 11/2005 | Arghavani et al. .......... 438/405 |

FOREIGN PATENT DOCUMENTS

| | | |
|---|---|---|
| JP | 2003/158241 A | 5/2003 |
| JP | 2003/179157 A | 6/2003 |
| WO | WO 03/098664 A2 | 11/2003 |

* cited by examiner

TRANSISTOR ARRANGEMENT IN MONOCRYSTALLINE SUBSTRATE HAVING STRESS EXERTING INSULATORS

BACKGROUND AND SUMMARY

The invention relates to a field effect transistor structure having a mechanically stressed active area which is formed by a section of a monocrystalline semiconductor substrate and in which, in a conducting state of the field effect transistor, a drain current flows through a channel region between a source region and a drain region in the direction of a channel axis and parallel to a structure surface of the semiconductor substrate, and a stress control structure which is next to the active area along an interface, is mechanically stressed in tension and induces a tensile stress in the active area. The invention also concerns another field effect transistor, a transistor arrangement structure having n-channel and p-channel field effect transistors and methods respectively for producing a semiconducting substrate and a transistor arrangement having n-channel and p-channel field effect transistors.

A mechanical stress acting in a monocrystalline semiconductor substrate affects the mobility of charge carriers in the semiconductor substrate. The effect of the mechanical stress depends on the direction of the charge carrier flow and on the charge carrier type. The mobility of electrons parallel to a (001) crystal face of a silicon substrate rises monotonically both with a length of the charge carrier flow and with a tensile stress acting transversely to the charge carrier flow. The mobility of holes in the direction of the charge carrier flow rises monotonically with a compressive stress acting along the charge carrier flow. The effect of a mechanical stress acting perpendicularly to the charge carrier flow on the mobility of holes depends on the orientation of the charge carrier flow with respect to the crystal axes.

In a field effect transistor, a charge carrier flow in the conducting state flows as a drain current through a channel region between a source region and a drain region. The channel region, the source region and the drain region are formed inside a monocrystalline semiconductor substrate. It is known to permanently expand or contract the crystal structure of the semiconductor substrate deliberately in a suitable way in order to increase the charge carrier mobility of electrons or holes, especially in the channel region. This leads to a reduced drain/source resistance $R_{DSon}$ in the conducting on state.

A method for increasing the lattice constant of a silicon substrate is specified in patent U.S. Pat. No. 6,717,213 B2 (Doyle et al.). This method is based on applying a thin silicon crystal on a silicon-germanium substrate. Since silicon-germanium has a significantly higher lattice constant than pure silicon, the lattice constant of the silicon is stretched to the lattice constant of silicon-germanium owing to the binding energy.

A disadvantage encountered with the method according to the prior art is that the likelihood of crystal structure defects in stretched silicon is very high.

U.S. Pat. No. 5,534,713 (Ismail et al.) describes a transistor arrangement which has both p-channel field effect transistors (p-type FETs) and n-channel field effect transistors (n-type FETs). The p-type FETs are tensioned, or stressed, less strongly in the channel region than the n-type FETs. The n-type FETs are formed in a silicon layer with a stretched lattice constant, which is grown on a silicon-germanium support.

In a transistor arrangement having n-type FETs and p-type FETs according to U.S. Pat. No. 6,682,965 (Noguchi et al.), the source and drain regions are respectively formed fully inside a stressed layer.

According to a method described in U.S. 2003/0040158 (Saitoh), planar n-type FETs are covered with a first nitride layer stressed in tension, and planar p-type FETs are covered with a second nitride layer stressed in compression. A tensile stress imparted by the first nitride layer compensates for a compressive stress, acting due to production in the channel region of the n-type FETs, to a greater extent than the second nitride layer compensates for a compressive stress acting due to production in the channel region of the p-type FETs.

A presentation of the relationship between a mechanical stress along and transverse to a channel axis determined by the direction of the drain current, on the one hand, and the resulting relative change in the maximum drain current, on the other hand, is given in U.S. 2004/0075148 (Kumagai et al.) for an orientation of the channel axis along or parallel to a <110> crystal axis of a monocrystalline silicon substrate. According to a transistor arrangement having planar n-type FETs and p-type FETs described therein, the sections of the source and drain regions next to a structure surface of the silicon substrate are covered with a stress regulating layer. First sections of the stress regulating layer over the n-type FETs are stressed in tension, and second sections of the stress regulating layer over the p-type FETs are stressed in compression. Owing to the modified lattice constants in the sections of the semiconductor substrate which are next to the stress regulating layer, the mobilities of electrons in n-type FETs and holes in p-type FETs are improved independently of each other so that the functionality is improved both for the n-type FETs and for the p-type FETs.

The dependency of a maximum drain current in p-type FETs and n-type FETs on mechanical stresses along and transverse to a channel axis, which is oriented along a <100> crystal axis, is described in U.S. 2004/0217448 (Kumagai et al.).

In multilayered substrates, for instance according to U.S. Pat. No. 5,534,713, relaxation processes in the initially stressed substrate lead to a high density of lattice defects.

Stress regulating layers, which cover the respective transistor structure, impede access or contact from above to the covered structures. A stress induced parallel to the interface falls off rapidly as the distance from the interface increases. A high mechanical stress at the interface between the stress regulating layer and the semiconductor substrate may be detrimental to the adhesion of the stress regulating layer and consequently the reliability of the transistor.

It is an object of the invention to provide field effect transistor structures which have a high charge carrier mobility and a low drain/source resistance in the conducting state, and the production of which can be readily integrated into conventional fabrication processes. It is also an object to provide a transistor arrangement having n-channel and p-channel field effect transistors, the current driver properties of which are improved independently of each other. It is another object of the invention to provide a method for producing a semiconducting monocrystalline substrate and a method for producing a transistor arrangement having n-channel and p-channel field effect transistors, by which the current driver properties of both transistor types can be improved.

The inventive concept common to all the various aspects of the invention is that insulator structures, which are commonly introduced for instance to separate field effect transistors in a semiconductor substrate, may be used as stress control structures for generating suitable tensile and compressive stresses.

According to a first aspect of the invention, to this end, an insulator structure is provided which imparts a tensile stress to an adjacent active area of a field effect transistor after material shrinkage.

According to a second aspect of the invention, the insulator structures for p-type FETs are supplemented with buffer layers which respectively grow selectively on a suitable interface between the active area, or the semiconductor substrate, and the adjacent insulator structure, and which induce a compressive stress in the adjacent structures by volume expansion.

A transistor arrangement having n-type FETs and p-type FETs according to a third aspect of the invention has insulator structures with a section stressed in tension and without a buffer layer in proximity to the n-type FETs, and at least partially insulator structures with a buffer layer in proximity to the p-type FETs.

Other aspects of the invention relate to the specification of methods for producing mechanically stressed semiconductor substrate sections and transistor arrangements.

According to the first aspect of the invention, a section of a monocrystalline semiconductor substrate forms an active area in which a zone region, a drain region and a channel region of a field effect transistor structure are formed by zones of different doping. The channel region is arranged between the source region and the drain region, is next to a structure surface of the semiconductor substrate and is insulated by a gate dielectric from a gate electrode lying on the structure surface. In the conducting state of the field effect transistor structure, a drain current flows essentially along a channel axis and parallel to the structure surface between the source region and the drain region.

Under normal conditions (normal pressure, normal temperature), the active area is mechanically stressed in tension. The mechanical stress acting in the active area is induced by a stress control structure which is next to the active area along an interface and is mechanically stressed in tension.

According to the invention, the interface is respectively inclined by at least 30 degrees relative to the structure surface and relative to the channel axis. Preferably, the interface is essentially orthogonal to the channel axis and inclined by at least 45 degrees relative to the structure surface. More preferably, the interface is essentially orthogonal to the structure surface.

To this end, the stress control structure is provided in a trench which, in addition to the active area, is introduced into the semiconductor substrate from the structure surface. The source and drain regions respectively remain accessible from above. Burying the stress control structure in the semiconductor substrate improves the adhesion of the stress control structure on the semiconductor substrate, while having an equal magnitude of the induced stress. A high tensile stress can advantageously be induced in the active area.

The stress control structure locally exerts a tensile stress of at least 50 MPa on the active area, preferably more than 100 MPa. As a consequence of the tensile stress induced by the stress control structure, a lattice constant of the semiconductor substrate in the active area is increased relative to a lattice constant of the semiconductor substrate outside the active area.

The stress control structure preferably consists of a dielectric material or a plurality of dielectric materials, and also forms an insulator structure which electrically insulates the active area. The extra process outlay advantageously remains low, and no additional space is required in order to produce the stress control structure.

The insulator structure comprises at least one base section. The base section is generated by applying and subsequently compacting a suitable trench filler. During the application, the trench filler fills the trenches completely. When compacted, the trench filler adheres well to the surrounding semiconductor substrate so that the insulator structure is stressed in tension by the compaction. The stressed insulator structure produces a tensile force, which impinges on the interface with the semiconductor substrate and has a component orthogonal to the interface. The tensile force imparts a tensile stress acting at least in adjacent sections of the active area.

The source region and the drain region are preferably n-doped. The channel region is intrinsically conductive or weakly p-doped. The field effect transistor structure is an n-channel field effect transistor. The charge carrier mobility of electrons in the stretched channel region is increased, and the source/drain resistance in the conducting state of the n-type FET is reduced.

The tensile stress induced in the active area is preferably increased by a second insulator structure, which lies opposite the first insulator structure on the active area and otherwise has the features of the first insulator structure.

The insulator structures are either respectively provided in extension of the channel axis next to the active area or delimit the active area laterally, or in a direction transverse to the channel axis.

According to a preferred embodiment of the field effect transistor structure according to the invention, two further insulator structures are provided which respectively delimit the active area at least locally in the vicinity of the channel region, transversely to the first two insulator structures, and which lie opposite each other on the active area. The further insulator structures are formed in the same way as the first insulator structure and have the same features, apart from the orientation with respective to the assigned active area.

The active area of an n-channel field effect transistor is therefore advantageously stressed in tension both along the channel axis and transversely to the channel axis. The lattice constant is increased along and transversely to the channel. The transistor properties of an n-type FET formed in this way are further improved.

In another preferred embodiment, oxide layers respectively at least 1 nanometer and at most 30 nanometers thick are formed along the interfaces between the insulator or stress control structures. The oxide layers are generated by oxidation of the semiconductor substrate after the introduction of the trenches and before the introduction of the trench filler. The formation of the oxide layers remedies defects in the crystal structure of the semiconductor substrate which are attributable to the etching of the trenches.

An active area of another field effect transistor structure is formed as a section of a semiconductor substrate and is next to a structure surface of the semiconductor substrate. A source region, a channel region and a drain region, which are respectively arranged one after the other along a channel axis, are formed inside the active area. In a conducting state of the field effect transistor, a drain current flows through the channel region between the source region and the drain region in the direction of a channel axis and parallel to a structure surface of the semiconductor substrate.

A first stress control structure and a second stress control structure are next to the active area along two interfaces, which are respectively inclined by at least 30 degrees relative to the structure surface. The first and second stress control structures are respectively stressed compressively under normal conditions, and induce a compressive stress between them in the active area.

The stress control structures are respectively provided in trenches introduced into the semiconductor substrate from the structure surface.

The lattice constant of the semiconductor substrate in the active area is reduced between the first and second stress control structures relative to a lattice constant of the semiconductor substrate in a compressive and tensile stress-free state.

A third stress control structure and a fourth stress control structure lie opposite each other on the active area, and delimit the active area transversely to the orientation of the first and second stress control structures.

The third and fourth stress control structures are respectively stressed in tension under normal conditions, and induce a tensile stress between them in the active area.

With an orientation of the channel axis parallel to a <110> crystal axis of a silicon substrate having a (100) surface orientation, the first and second stress control structures delimit the active area in extension of the channel axis, and induce a compressive stress in the active area along the channel axis. The third and fourth stress control structures delimit the active area transversely to the channel axis, and preferably induce a tensile stress in the active area orthogonally to the channel axis. For p-type FETs thus oriented with respect to the crystal lattice, a higher maximum drain current is obtained when the compression transverse to the channel axis is reduced relative to the compression along the channel axis or, preferably, is converted into a tension.

With an orientation of the channel axis parallel to a <100> crystal axis, a compressive stress transverse to the crystal axis may sometimes improve the mobility of holes to a greater extent than a compressive stress along the channel axis. The first and second stress control structures are then preferably provided respectively parallel to the channel axis. It is then possible for the third and fourth stress control structures to be of the same type as the first and second stress control structures. Uniform processing of the stress control structures in the region of the p-type FETs is thereby advantageously obtained.

For silicon substrates with a surface orientation other than (100), for instance a (111) surface orientation, the design of the stress control structure for p-type FETs and n-type FETs is accordingly conditioned by the dependency of the mobility of holes and electrons on the orientation of the crystal axis.

The stress control structures preferably form insulator structures and respectively comprise at least one compressive stress-free base section made of one or more dielectric materials and a buffer layer, which is formed between the base section and the active area. Due to production, the buffer layer is suitable for inducing a compressive stress in the active area.

The buffer layer is grown on the active area along the interface of the active area. During the growth, material is incorporated into the growing buffer layer so that the buffer layer exerts a mechanical pressure on the adjacent active area due to the volume increase.

Preferably, the source region and the drain region are p-doped and the channel region is intrinsically conductive or n-doped. The field effect transistor structure forms a p-channel field effect transistor.

The maximum drain current of the p-type FET is increased owing to the higher mobility of holes in the channel region. The time response and the current driver properties of the p-type FET are improved. Superficial stress regulating layers or underlying germanium-silicon layers can advantageously be obviated.

Due to production, the layer thickness of the buffer layer decreases continuously starting from the structure surface of the semiconductor in the depth direction of the semiconductor substrate.

The insulator or stress control structure is preferably generated from a trench filler suitable for compaction, with which the trench is filled and which is compacted in the course of a subsequent treatment. Owing to the material shrinkage of the trench filler, the adjacent active area experiences a tensile stress which is at least partially compensated for by the buffer layer, or converted into a compressive stress.

Suitable trench fillers are, in particular, spin-on glass materials which shrink to a sufficient extent under suitable process conditions while remaining connected to adjacent sections of the semiconductor substrate.

The base section of the insulator structure is preferably generated by depositing and subsequently compacting a trench filler based on polysilazane, the trench filler being applied in liquid or fluid form and completely filling the intended trenches.

Subsequent to the formation of the base section, the buffer layer may advantageously be formed by oxidation of the semiconductor substrate which preferably consists of monocrystalline silicon. The buffer layer then has a different etching resistance to a conventional etchant than the base section.

The third and fourth stress control structures differ from the first insulator structure by having buffer layers which are thinner on average by more than 50%, or by the complete absence of buffer layers.

Another aspect of the invention relates to a transistor arrangement having at least one n-type FET and at least one p-type FET, and having insulator structures.

An active area of the n-type FET is formed as a section of a monocrystalline semiconductor substrate. In a conducting state of the n-type FET, a drain current flows parallel to a structure surface of the semiconductor substrate and along an n-channel axis through a channel region between a source region and a drain region of the n-type FET. Along an interface orthogonal to the n-channel axis, there is an n-type FET insulator structure next to the active area.

Correspondingly, an active area of the p-type FET is formed as another section of the semiconductor substrate. In a conducting state of the p-type FET, a drain current flows parallel to a structure surface of the semiconductor substrate and along a p-channel axis through a channel region between a source region and a drain region of the p-type FET. Along an interface, which is essentially orthogonal to the p-channel axis and inclined by at least 30 degrees to the structure surface, there is a p-type FET insulator structure next to the active area of the p-type FET.

According to the invention, the n-type FET insulator structure is stressed in tension and induces a tensile stress in the active area of the n-type FET parallel to the n-channel axis, while the p-type FET insulator structure is either stressed in tension to a lesser extent or in compression, and induces a reduced tensile stress or a compressive stress in the active area of the p-type FET parallel to the p-channel axis.

Advantageously, the lattice constant of the semiconductor substrate along the n-channel axis in the active area of the n-type FET is increased substantially more than a lattice constant of the semiconductor substrate in the active area of the p-type FET along the p-channel axis. The lattice constant in the region of the p-type FET is preferably reduced relative to an intrinsic lattice constant characterizing the relaxed state under normal conditions along the channel axis.

n-Type FETs and p-type FETs are improved independently of each other with respect to the mobility of the charge carriers.

Preferably, the n-type FET insulator structure and the p-type FET insulator structure respectively have a base section which is compressive stress-free or stressed in tension.

This advantageously leads to be simplified process flow. Advantageously, the insulator structures may furthermore be provided respectively between a p-type FET and an n-type FET.

The base sections are preferably generated by applying and subsequently compacting a trench filler.

According to a preferred embodiment of the invention, at least the p-type FET insulator structure is supplemented with a buffer layer which is arranged along the interface between the insulator structure and the active area.

The buffer layer is generated e.g. after formation of the base section by the incorporation of oxygen into the semiconductor substrate, and is suitable for generating a compressive stress in neighboring structures. Owing to the space demanded by the incorporated material, this type of production creates a compressive stress in the buffer layer under normal conditions. Such a buffer layer is suitable for inducing a compressive stress in neighboring structures, or compensating at least partially for a tensile stress acting there.

Particularly preferably, the buffer layer is substantially absent in the n-type FET insulator structures so that the tensile stress on the active area of the n-type FET due to the n-type FET insulator structures remains maximal.

The buffer layer differs from the base section, inter alia, by having different etching properties.

According to other preferred embodiments, the active areas of the p-type FET and of the n-type FET are delimited by further p-type FET and n-type FET insulator structures, respectively. Regarding the respective field effect transistor structures, reference is made to the comments above.

p-Channel and n-channel field effect transistor structures are advantageously optimized with respect to the electrical parameters that depend on mechanical stresses parallel and transverse to the channel axis. It is possible to produce comparatively high mechanical stresses in the active area. If the compressive stress structures are continued into the depth of the semiconductor substrate, the region of influence of the compressive stress structures is greater than that of superficial layers.

Another aspect of the invention relates to transistor arrangements respectively having two field effect transistors of the same channel type.

A first n-type FET and a second n-type FET of a first such transistor arrangement respectively have an active area which is formed by a section of a monocrystalline semiconductor substrate. There are insulator structures respectively next to the active areas, e.g. first insulator structures in the direction of a channel axis and second insulator structures orthogonally to the channel axis.

According to the invention, the insulator structures next to the first n-type FET are stressed in tension and the insulator structures next to the second n-type FET are compressively stressed.

In a transistor arrangement having p-type FETs, sections of a monocrystalline semiconductor substrate form active areas of a first p-type FET and a second p-type FET. First insulator structures are next to the active areas in the direction of a channel axis, and second insulator structures are next to the active areas or thogonally to the channel axis.

According to the invention, the first insulator structures next to the first p-type FET and the second insulator structures next to the second p-type FET are compressively stressed, and the second insulator structures next to the first p-type FET and the first insulator structures next to the second p-type FET are stressed in tension.

In the two transistor arrangements, respectively, the mobility of electrons in the first n-type FET and the mobility of holes in the first p-type FET are increased, and the drain/source resistance is reduced. The mobility of electrons or holes is reduced for the second n-type FET and the second p-type FET, respectively, and a leakage current which increases with the mobility of electrons or holes is therefore also reduced.

According to the method according to the invention for producing a semiconducting monocrystalline substrate, a substance exerting a tensile stress on the substrate is connected to the substrate.

The tensile stress exerts a static force on the substrate. In order to establish force equilibrium, therefore, a counterforce has to be produced. Since the substance is firmly connected to the substrate, the counterforce is applied by stretching the substrate crystal.

In a particular configuration of the method according to the invention, a substrate part of an overall substrate is formed such that a trench, which delimits the substrate part and is filled with the substance, is introduced into the overall substrate. The result of this, depending on the design, is an at least two-sided contact between the trench and the substrate part. On these contact surfaces, the substrate enters into a mechanically highly load-bearing bond with the substrate, and can therefore exert the tensile stress according to the invention.

The trench may be filled by a so-called spin-on method, the dissolved filler being applied in liquid form to the substrate and subsequently distributed uniformly over the surface by means of rotation.

In a particular configuration of the method according to the invention, the trench is provided with an oxide or nitride on its surface. This step is used to passivate the trench and achieve stronger bonds between the substance and the surface.

In a particular configuration of the method according to the invention, the surface of the trench is oxidized. This creates a surface oxide which improves the adhesion conditions between the substrate and the substance exerting the tensile stress.

In a particular configuration of the method according to the invention, the introduced substance shrinks as it sets. The shrinkage of the substance produces a static tensile stress, which acts on the contact surfaces between the substance and the substrate.

The setting of the substance is in this case carried out in a plurality of stages, with another substance additionally being used to expel the solvent. In the case of polysilazane as the filler, in order to make it set, water vapor is introduced into the environment of the wafer and expels the solvent in the form of ammonia. In order to prevent undesirable oxidation of the silicon, this process step is carried out as briefly as possible and at a temperature which is as low as possible. After the treatment with water vapor, a further process step is then carried out at a higher temperature in a nitrogen environment.

In a particularly favorable configuration of the method according to the invention, this procedure is carried out in the following method steps:
  etching trenches into the semiconductor substrate, so that substrate parts are obtained, then
  oxidizing the surface of the trenches, or applying an oxide/nitride, then
  filling the trenches with a dissolved substance in liquid form by means of a spin-on method, then
  heating the substrate, then
  regulated/stepwise cooling of the substrate.

In a particular configuration of the method according to the invention, the substrate is silicon and the substance is polysilazane.

In a particular configuration of the method according to the invention, the substrate is silicon and the substance is a material based on polysilazane.

In the course of a method for producing a transistor arrangement having a first field effect transistor and a second field effect transistor, a semiconductor substrate is provided first. Trenches are introduced into the semiconductor substrate, with an active area of the first field effect transistor and an active area of the second field effect transistor each being formed by a section respectively delimited by two trenches. A trench filler is introduced into the trenches. The trench filler adheres to the surrounding semiconductor substrate and contains secondary substances. The trench filler is compacted in the course of a subsequent treatment, the trench filler remaining connected to the semiconductor substrate. The trench filler shrinks owing to the compaction. The shrunk trench filler exerts a tensile force on the adjacent active area.

A mask is applied. The mask covers the edges of those insulator structures which are assigned to the first field effect transistor. At least one of the edges, which are formed on the structure surface between the active area of the second field effect transistor and one of the adjacent insulator structures, is not covered by the mask and remains exposed.

An oxidation process is controlled in an environment from which oxygen is made available. The oxygen diffuses through the material of the insulator structure onto the interface between the active area and the insulator structure below the exposed edge. The oxygen reacts with the silicon of the active area to form silicon oxide. Owing to the space demanded by the silicon oxide buffer layer growing on the interface, a compressive stress is produced in the adjacent structures. The lattice constant in the adjacent active area is advantageously reduced.

According to a first preferred embodiment of the method according to the invention, the first field effect transistor is an n-channel field effect transistor and the second field effect transistor is a p-channel field effect transistor.

In a preferred embodiment of the method according to the invention, in addition to the trenches beside the active areas, further trenches are introduced which delimit the respective active area at least in sections along the channel region transversely to the channel axis. As a result, the regions of the first field effect transistors are entirely covered by the mask.

With an orientation of the channel axis parallel to the <100> crystal axis of a silicon substrate, for which the effect of a mechanical stress parallel to the channel axis is small and a compressive stress transverse to the channel axis increases the mobility of the holes in the direction of the drain current, it is preferable for all edges between the insulator structures and the adjacent semiconductor substrate, or the adjacent active area, to remain entirely exposed and not be covered by the mask.

The method according to the invention makes it readily possible for the lattice constants to be reduced in the region of p-type FETs and increased in the region of n-type FETs, so that both transistor types can be developed with a view to improved transistor properties independently of each other on the same substrate.

According to another preferred embodiment, both field effect transistors are either n-channel field effect transistors or p-channel field effect transistors.

The method according to the invention then makes it readily possible to produce two types of otherwise similar p-type FETs or n-type FETs, the first type having a minimal drain/source resistance $R_{DSon}$ and the second type having a minimal leakage current or off-state current.

The invention will be explained in more detail below with reference to the figures. Components and structures which correspond to one another are respectively provided with the same references. The figures represent the actual ratios in a form which is simplified, schematized and not true to scale.

DESCRIPTION

Figure 1:
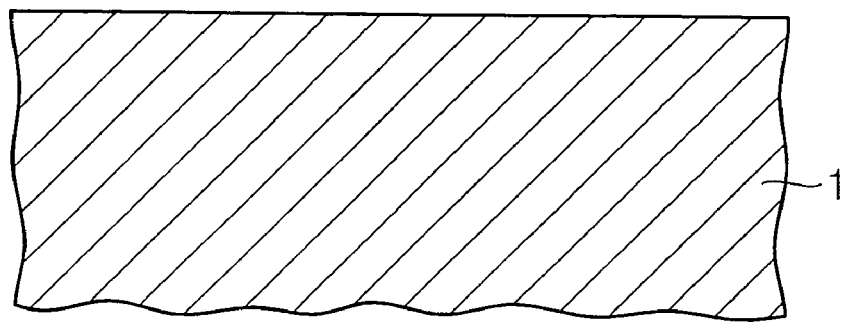
FIG. 1 shows the semiconductor substrate.
Figure 2:
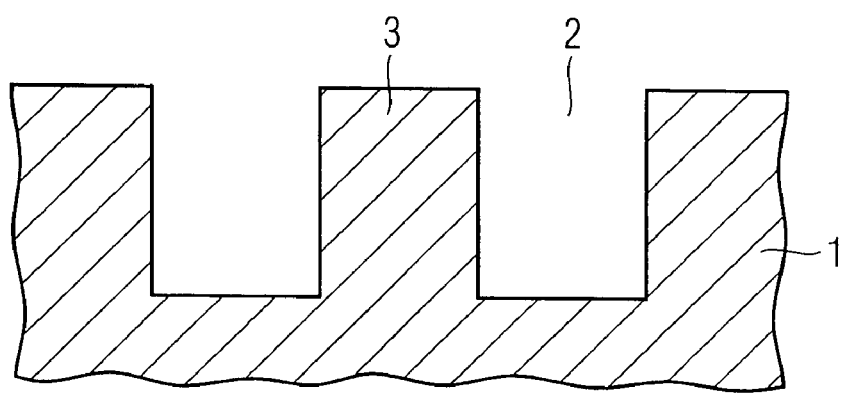
FIG. 2 shows the semiconductor substrate with the substrate part delimited by the trenches.
Figure 3:
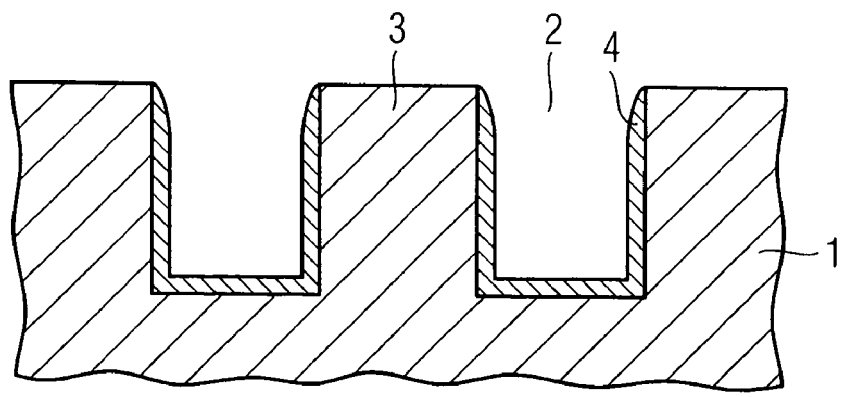
FIG. 3 shows the trenches provided with an oxide layer.
Figure 4:
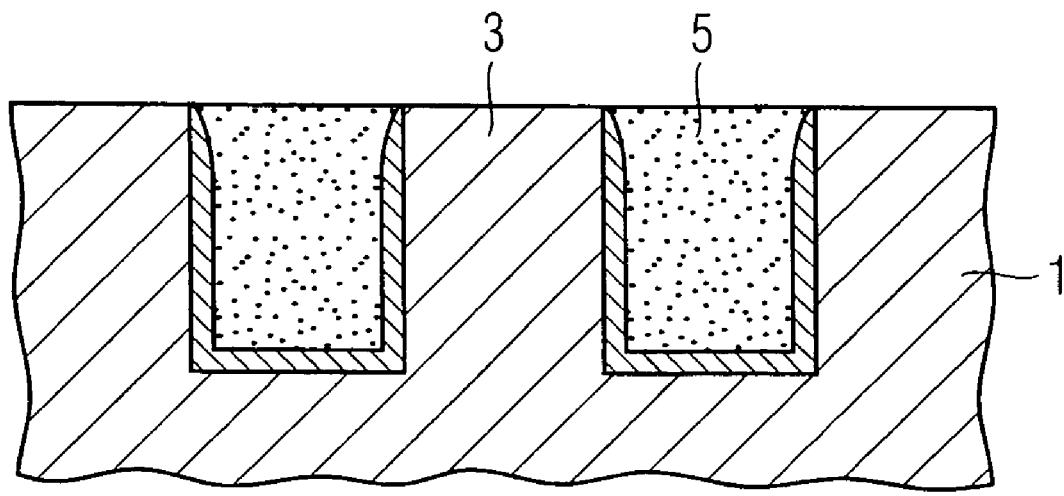
FIG. 4 shows the trenches filled with the substance.
Figure 5:
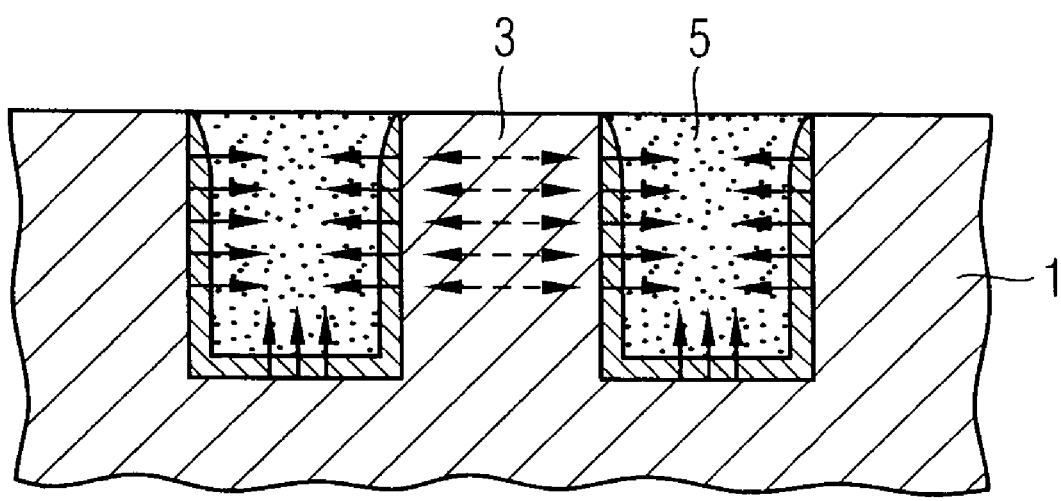
FIG. 5 shows the trenches with the substance shrunk and the forces acting.

FIGS. 1 to 5 show cross-sectional representations of a semiconductor substrate to illustrate a method for producing areas with an extended lattice constant by the processing of insulator structures according to a first exemplary embodiment of the invention.

As described, trenches 2 are etched into a monocrystalline substrate 1 by means of a photolithographic method. The trenches 2 isolate a substrate part 3 from the substrate 1.

The surface of the trenches 2 is then coated with an oxide 4 or nitride, or the surface of the trenches 2 is itself oxidized.

This serves, on the one hand, to passivate the trench surface. On the other hand, the oxide acts as a binder between the substance and the trench filler 5.

After the treatment of the trench surface, the dissolved substance 5 is introduced into the trenches by means of a spin-on method and binds to the oxide 4 on the trench surface.

After the substance 5 has been introduced, it is set so that the material experiences shrinkage.

In practice, the setting process involves a plurality of stages and, for example, is carried out first in water vapor in order to expel the solvent from the substance 5, and subsequently at a different temperature in nitrogen. Such a sequence may be implemented as follows:

30 minutes at 400° C. in water vapor, then 30 minutes at a temperature increased to 200° C.-700° C. in water vapor and then 30 minutes at 900° C. in a nitrogen environment.

The firm binding of the filler 5 to the oxide layer 4 and the shrinkage of the filler material which takes place lead to a static force which acts on the trench surface. As can be seen in the drawing, the substrate part 3 is in this case doubly loaded.

The forces now acting on the substrate part 3 significantly increase the lattice constant, in particular of the substrate part, and achieve the desired effect.

Figure 6A:
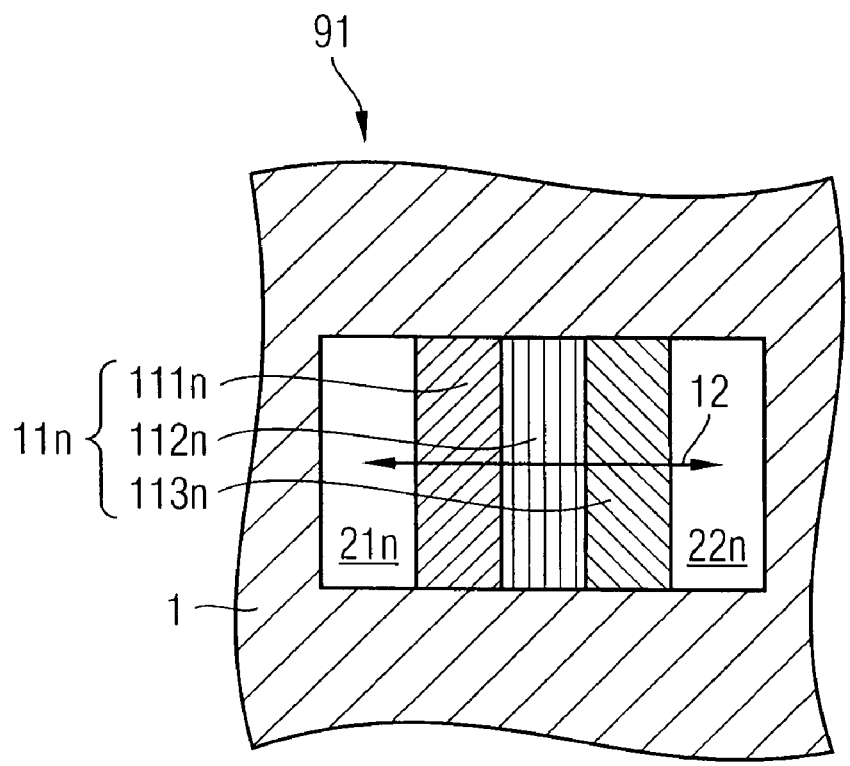
FIG. 6: shows simplified plan views of a semiconductor substrate to represent a method for producing a transistor arrangement having n-type FETs and p-type FETs with insulator structures according to a second exemplary embodiment of the invention.
Figure 6A:
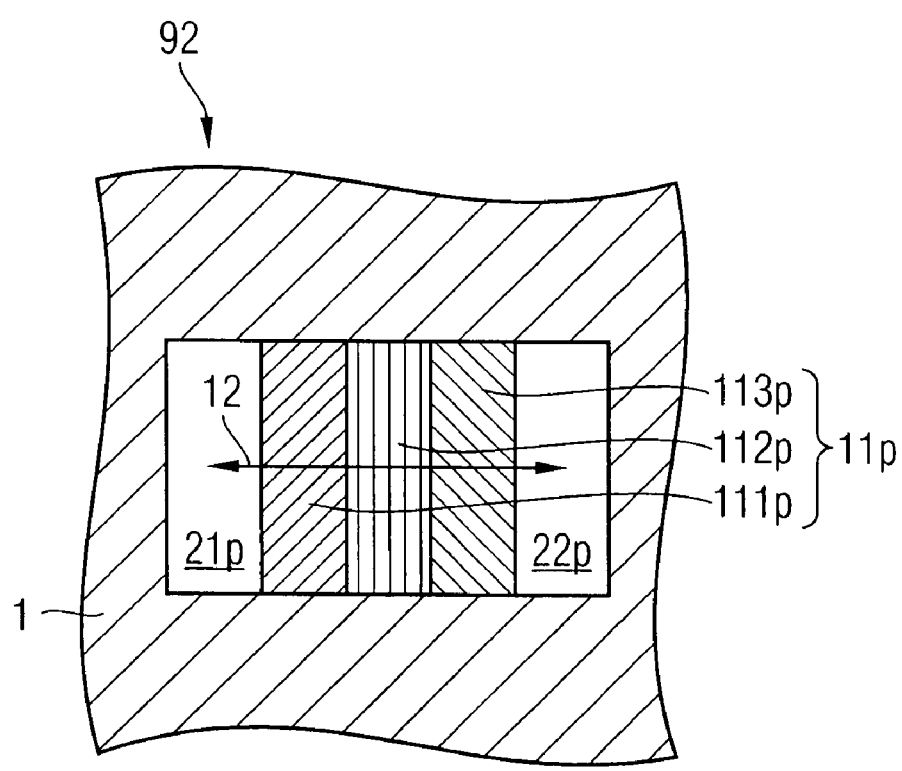
Figure 6B:
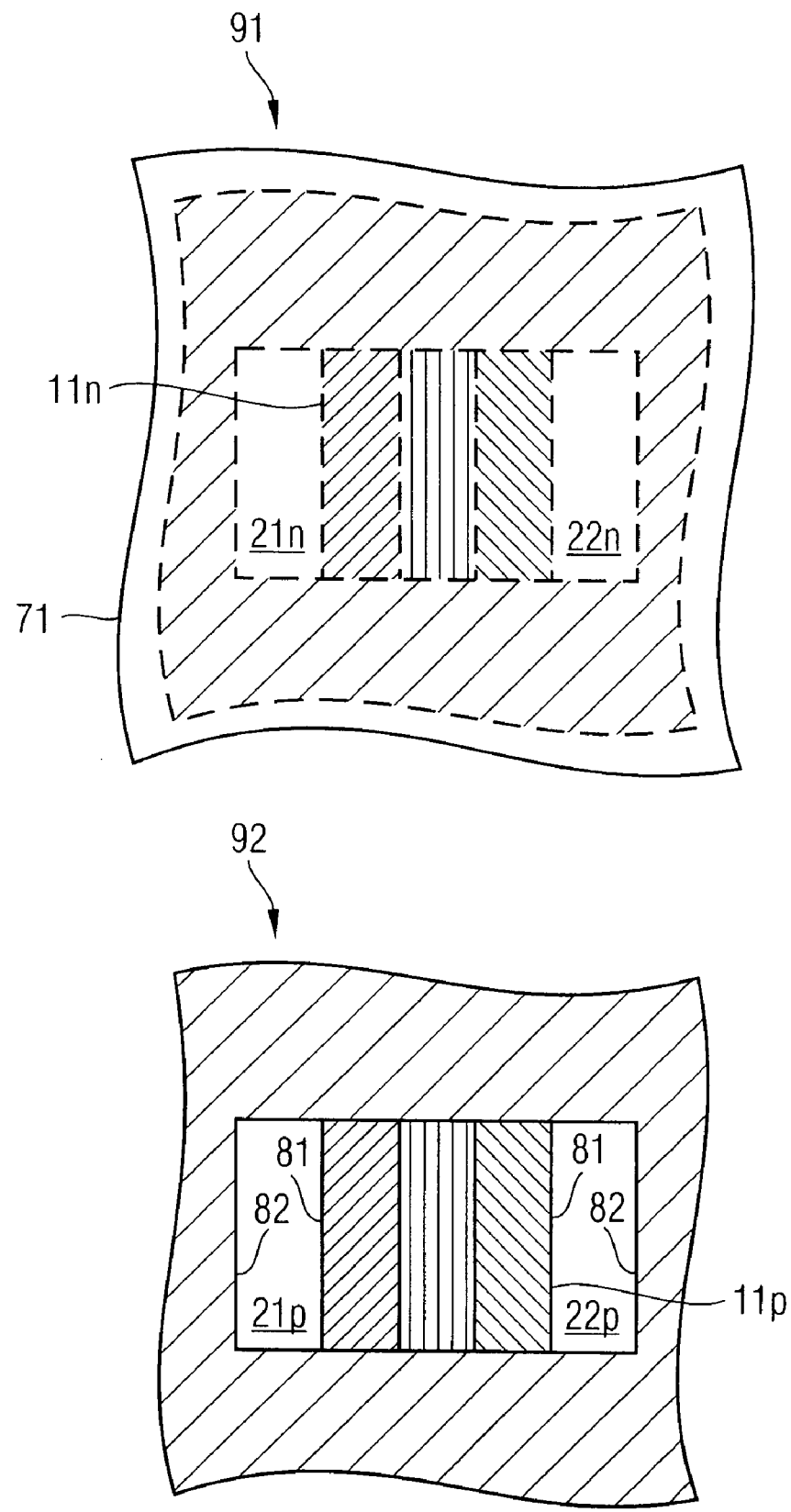
Figure 6C:
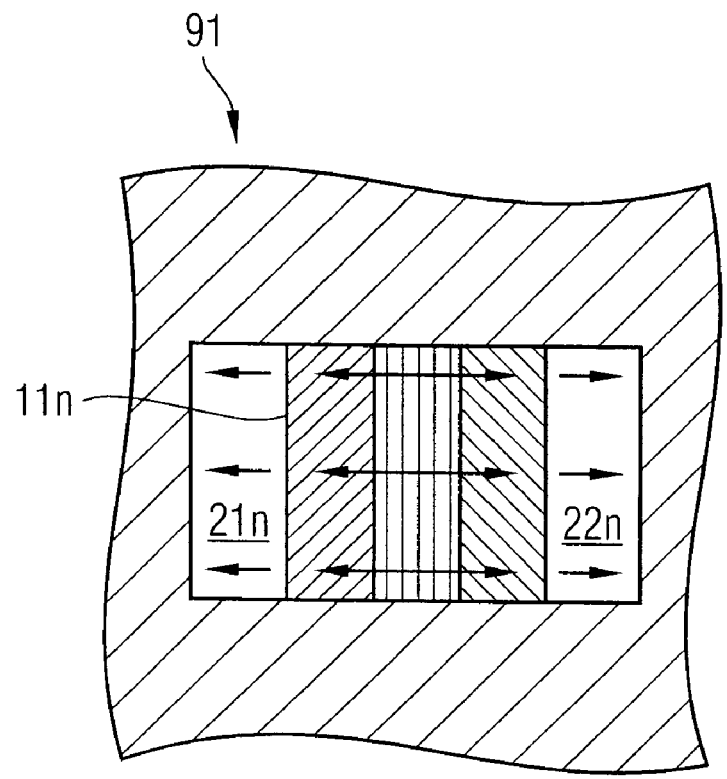
Figure 6C:
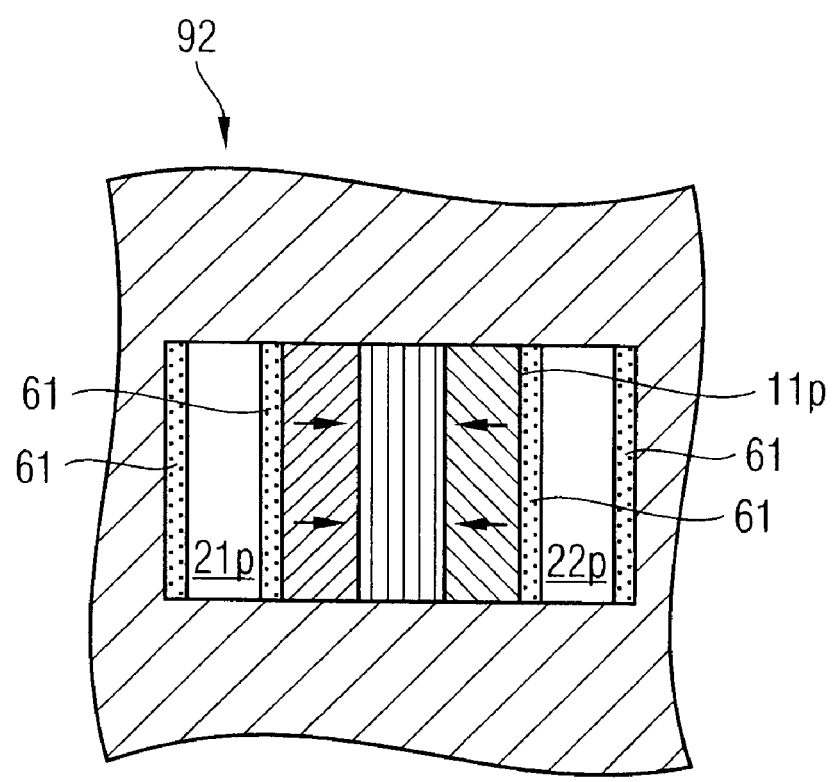

FIG. 6 respectively shows an n-type FET 91 in the left-hand part and a p-type FET 92 in the right-hand part of the three sub-figures FIG. 6A, FIG. 6B and FIG. 6C.

Starting with an unstructured monocrystalline silicon substrate as the semiconductor substrate 1, field regions are firstly defined which isolate active areas 11*n*, 11*p*, formed by the semiconductor substrate 1, of the FETs 91, 92 from one another and/or from further structures in the semiconductor substrate 1. To this end, trenches 2 are introduced into the semiconductor substrate 1 in the course of a photolithographic process. Along the trench walls, an approximately 5 nanometer thick oxide layer is thermally grown on the semiconductor substrate 1. The trenches 2 are filled with a spin-on glass (SOG) material as the trench filler 5. Solvents contained in the SOG material are expelled by a bake process at 180 degrees Celsius.

The SOG material is compacted by conversion into silicon oxide and expulsion of secondary substances resulting from the conversion, in a low-oxygen or oxygen-free environment. The conversion is carried out for instance by exposing the semiconductor substrate 1 for a half-hour in a humid ambient atmosphere at 300 to 400 degrees Celsius, for a further half-hour in a humid environment, for instance in water vapor at from 200 to 750 degrees Celsius, and another half-hour in a dry atmosphere. The volume of a polysilazane-based trench filler shrinks under said conditions by up to 13%, corresponding to a length shrinkage of 6%. If the adhesion of the trench filler to the silicon substrate is sufficient, a corresponding tensile force acts on the adjacent active area.

The n-type FET 91 and the p-type FET 92 respectively comprise an active area 11*n*, 11*p*, each having a source area 111*n*, 111*p*, a drain area 113*n*, 113*p* and a channel area 112*n*, 112*p*. Each channel area 112*n*, 112*p* is formed between the respective source area 111*n*, 111*p* and the respective drain area 113*n*, 113*p*. The position of the source area 111*n*, 111*p* relative to the respectively assigned drain area 113*n*, 113*p* determines the orientation of a channel axis 12, along which a charge carrier current flows as a drain current in the conducting state of the respective FET 91, 92. In extension of the channel axis 12, there are insulator structures 21*n*, 22*n*, 21*p*, 22*p* next to the respective active area 11*n*, 11*p* on both sides.

The active areas 11*n*, 11*p* are sections of a silicon substrate 1, and are next to a structure surface 10 of the silicon substrate 1. The insulator structures 21*n*, 22*n*, 21*p*, 22*p* are formed in trenches 2 introduced from the structure surface 10 into the silicon substrate 1.

A mask 71 is applied to the structure surface 10.

According to FIG. 6B, the mask 71 covers the region of the n-type FET 91 entirely. The region of the p-type FET 92, and in particular the edges 81 between the active area 11*p* and the insulator structures 21*p*, 22*p* and sections of the insulator structures 21*p*, 22*p* next to the edges 81, are not covered by the mask 71 and remain exposed.

An oxidation process is carried out in an environment which makes reactive oxygen available, as mentioned. On the surfaces of the active area 11*p* which are next to the insulator structures 21*p*, 22*p*, a buffer layer 61 up to 30 nanometers thick is formed on the semiconductor oxide.

The mask 71 is removed.

In the region covered by the mask 71, less oxygen is brought onto vertical interfaces of the active area 11 or the semiconductor substrate 1, on the one hand, and the respective insulator structures 21*n*, 22*n*. The region of the n-type FET which is covered by the mask 71 during the oxidation remains substantially unchanged relative to the state before the mask 71 was applied.

The insulator structures 21*n*, 22*n* exert a tensile stress on the active area 11*n* encompassed by them. The lattice constant in the active area 11*n* is increased parallel to the channel axis 12.

In the region of the p-type FET 92 which is not covered by the mask 71, oxygen diffuses through the oxygen-permeable material of the insulator structures 21*p*, 22*p*. The oxygen reaches the interfaces extending between the active area 11*p* and the adjacent insulator structures 21*p*, 22*p* below the uncovered edges 81, 82. Silicon oxide grows on the silicon interface 20.

According to the right-hand image in FIG. 6C, the resulting buffer structures 61 exert a tensile stress on the respectively adjacent structures 11*p*, 21*p*, 22*p* due to the space demanded by material growing because of the incorporated oxygen.

The method represented with the aid of FIG. 7 differs from the method represented with the aid of FIG. 6 by the provision of further insulator structures 23*n*, 24*n*, 23*p*, 24*p*, which delimit the respective active area 11*n*, 11*p* in a direction transverse to the channel axis 12. The method relates to a channel axis 12 parallel to a <110> crystal axis of a silicon substrate as the semiconductor substrate 1.

In this exemplary embodiment, a mask 72 covers the area of the n-type FET 93 entirely. In the region of the p-type FET 94, the mask 72 covers the edges 83, 84 of the insulator structures 23*p*, 24*p*. The edges 81, 82 of the insulator structures 21*p*, 22*p* are not covered by the mask 72.

During the subsequent oxidation, buffer layers 61 are formed only on the interfaces associated with the exposed edges 81, 82 between the insulator structures 21*p*, 22*p* and the active area 11*p* of the p-type FET 94, or the semiconductor substrate 1.

Figure 7A:
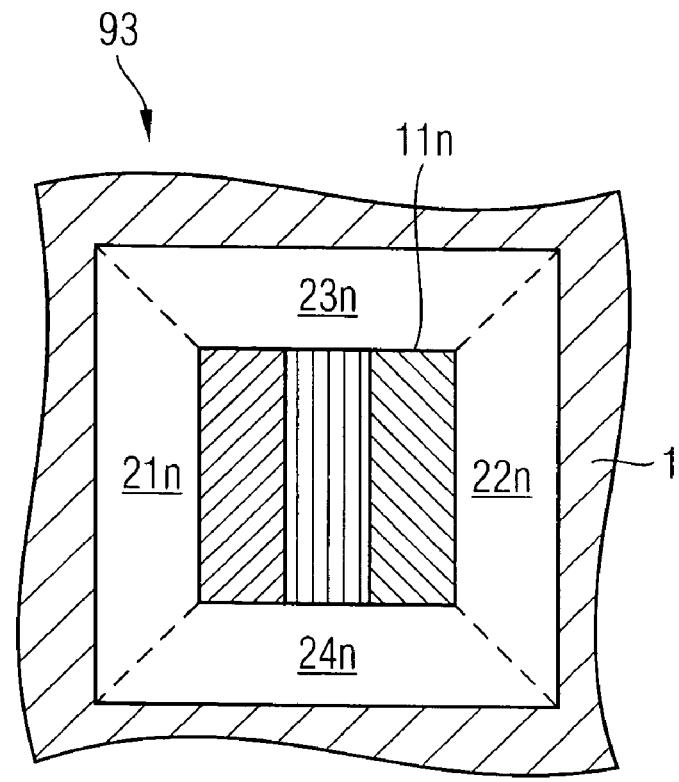
FIG. 7: shows simplified plan views of a semiconductor substrate to represent a method for producing a transistor arrangement having n-type FETs and p-type FETs with longitudinal insulator structures and transverse insulator structures according to a third exemplary embodiment of the invention.
Figure 7A:
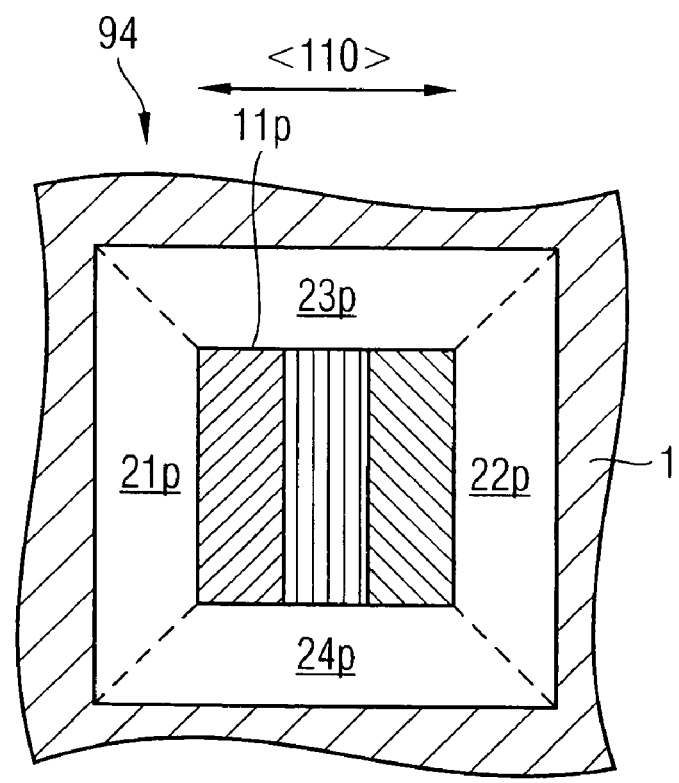
Figure 7B:
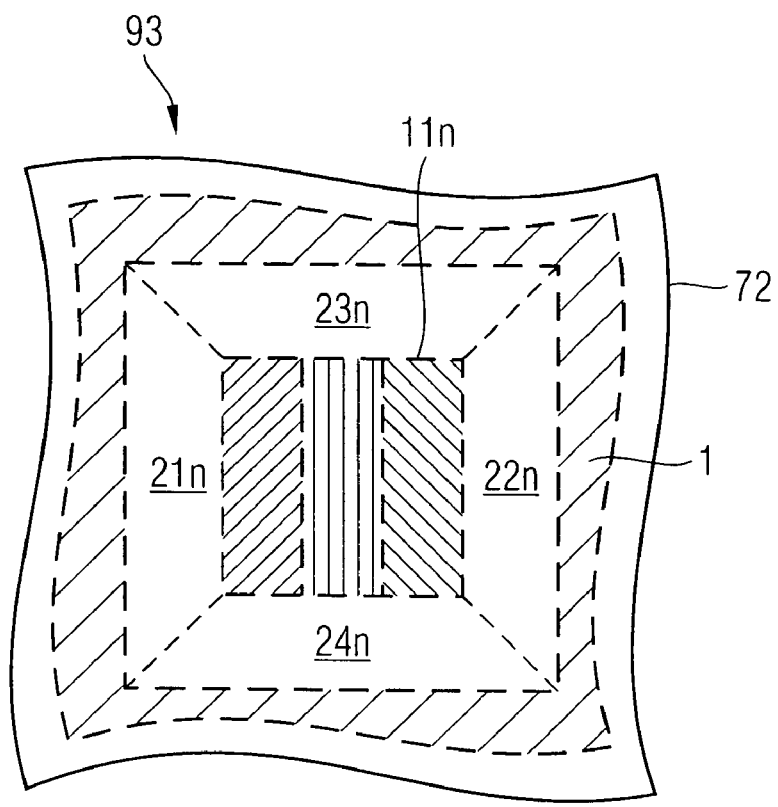
Figure 7B:
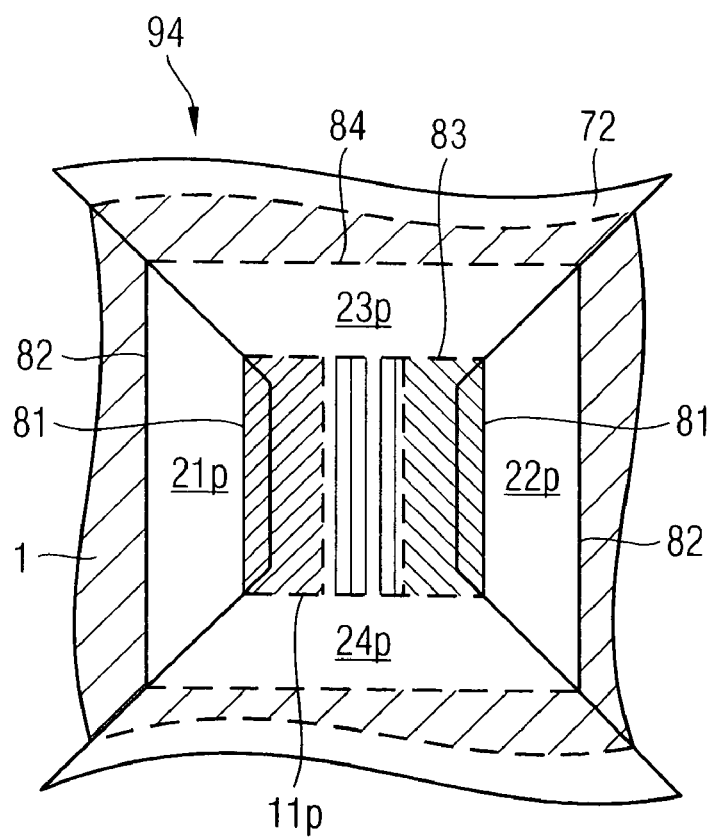
Figure 7C:
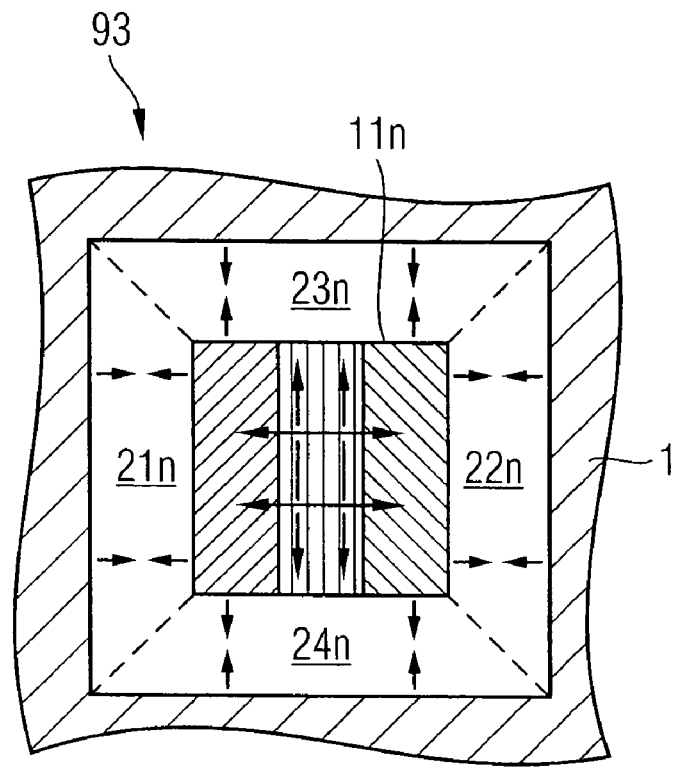
Figure 7C:
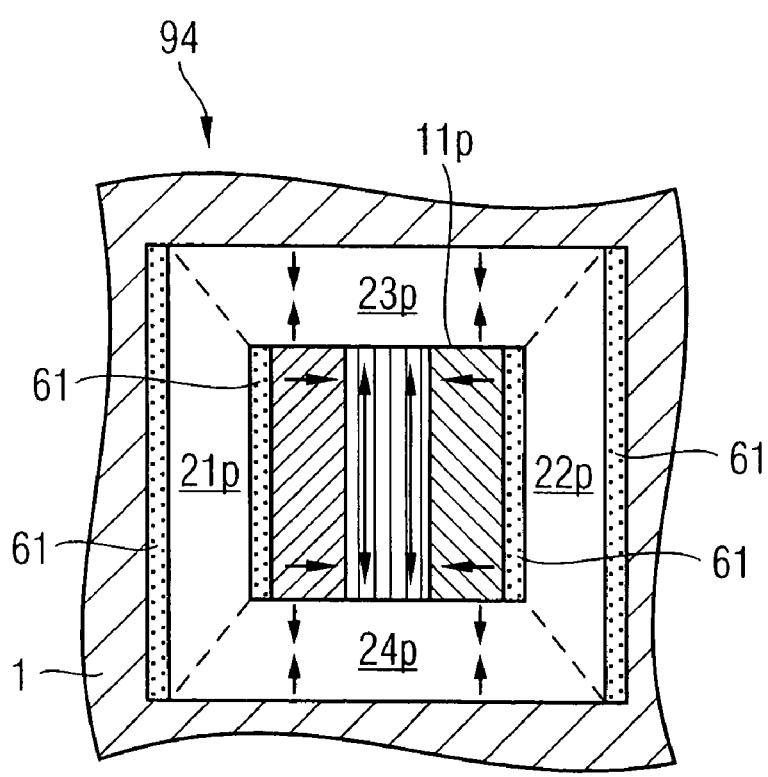

The resultant n-type FET 93 corresponding to the left half-image of FIG. 7C is stressed in tension both along the channel axis and transversely to the channel axis, so that an advantageous extended lattice constant is obtained in both orientations.

In the case of the p-type FET 94 represented in the right half-image of FIG. 7C, the buffer layers 61 exert a compressive force on the active area 11p similarly as in the example of FIG. 6C. A tensile stress is exerted on the active area 11p lying in between by the insulator structures 23p, 24p transversely next to the channel axis 12. The lattice properties in the region of the p-type FET 94 are developed with a view to improved transistor properties in two mutually orthogonal directions, independently of those of the n-type FET.

The method represented in FIG. 7C relates, in particular, to an orientation of the channel axis 12 parallel to the <110> crystal axis.

For the case of a <100> orientation of the channel axis 12 to the crystal axis, the mask 72 might possibly correspond substantially to the mask 71 so that the region of the n-type FET 93 is entirely covered and the region of the p-type FET 94 is entirely exposed. In contrast to the p-type FET 92 represented in FIG. 7C, further buffer layers 61 are then obtained at the interfaces of the insulator structures 23p, 24p with the active area 11p, or the substrate 1.

Figure 8:
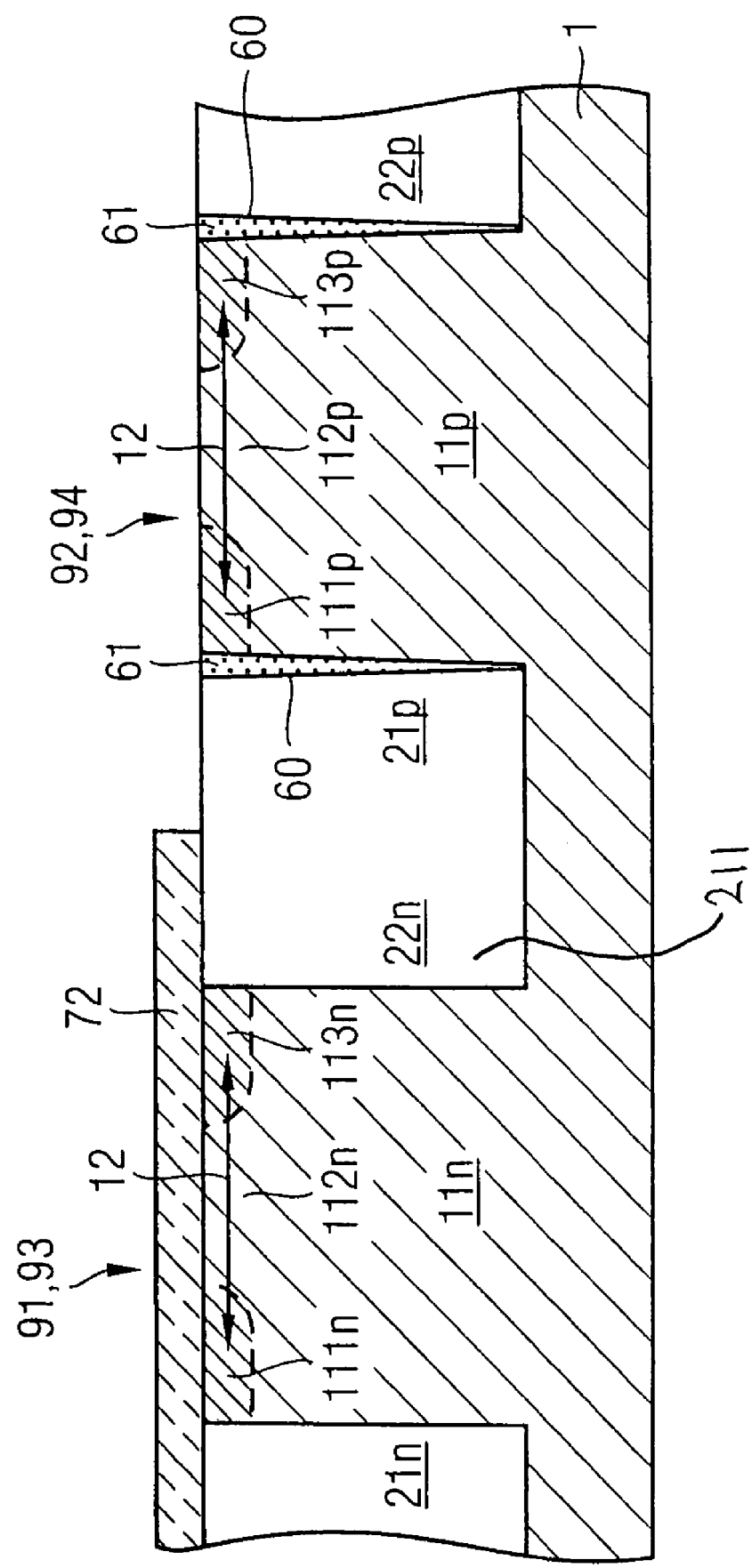
FIG. 8: shows a simplified cross section through a transistor arrangement processed according to the invention, with an n-channel FET and a p-channel FET.

FIG. 8 shows a cross section through an n-type FET 91 and a p-type FET 92 along the channel axis 12, corresponding to the plan view of FIG. 7B. In this exemplary embodiment, the right-hand insulator structure 22n of the n-type FET 91 and the left-hand insulator structure 21p of the p-type FET form a single insulator structure 22n, 21p. The buffer layer 61 tapering downward in the form of a wedge into the depth of the semiconductor substrate 1 can be seen from the cross-sectional representation. The depth of the insulator structures 21n, 22n, 21p, 22p may be 300 nm.

The mask 72 covers the active area 11n of the n-type FET 91 and an adjacent section of the insulator structure 22n, 21p. In this case, the mask 72 extends over the greater section of the insulator structure 22n, 21p so that the oxidation at the interface with the active area 11n of the n-type FET 91 is suppressed to a sufficient extent, while the buffer layer 61 is nevertheless formed on the p-type FET 92.

Figure 9:
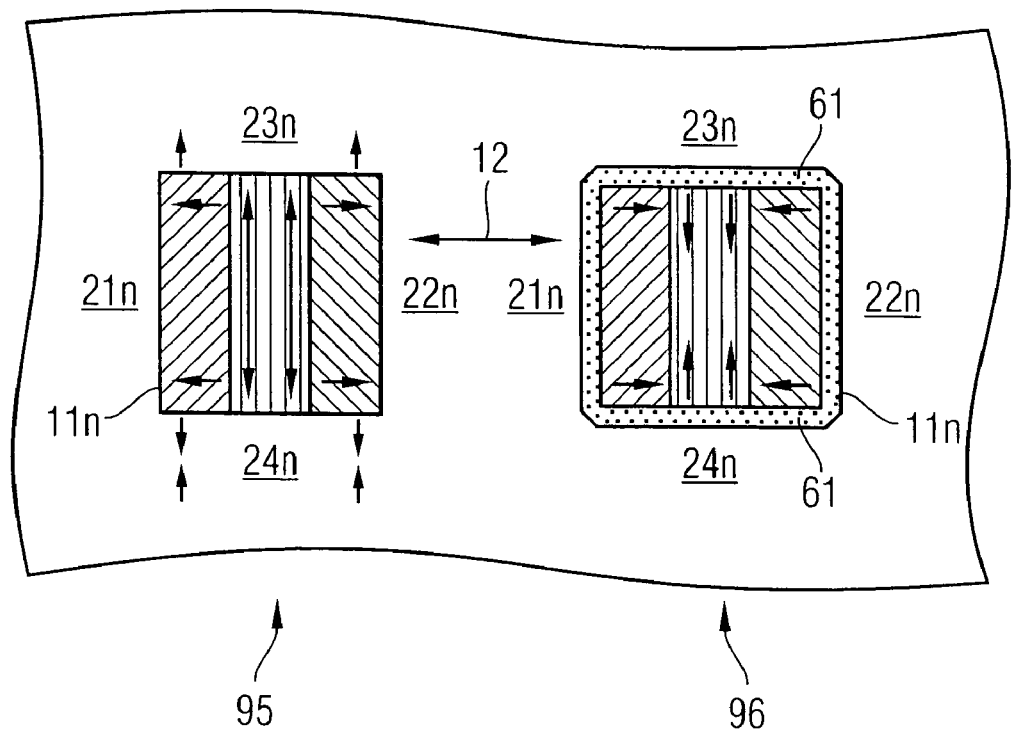
FIG. 9: shows a plan view of a transistor arrangement having two different n-type FETs according to another exemplary embodiment of the invention.

FIG. 9 shows a transistor arrangement having a first n-type FET 95 and a second n-type FET 96 in plan view. The two n-type FETs 95, 96 are embedded in a surrounding insulating structure, which is locally formed by the insulator structures 21n, 22n, 23n, 24n. The insulator structures 21n, 22n, 23n, 24n are stressed in tension. Between the active area 11n of the second n-type FET 96 and the neighboring insulator structures 21n, 22n, 23n, 24n, buffer layers 61 are formed which induce a compressive stress in the active area 11n of the second n-type FET 96. The induced compressive stress reduces the mobility of electrons and consequently a leakage current in the second n-type FET 96. In the first n-type FET, owing to the tensile stress induced by the insulator structures 21n, 22n, 23n, 24n, the mobility of electrons is increased and the drain/source resistance is reduced.

Figure 10:
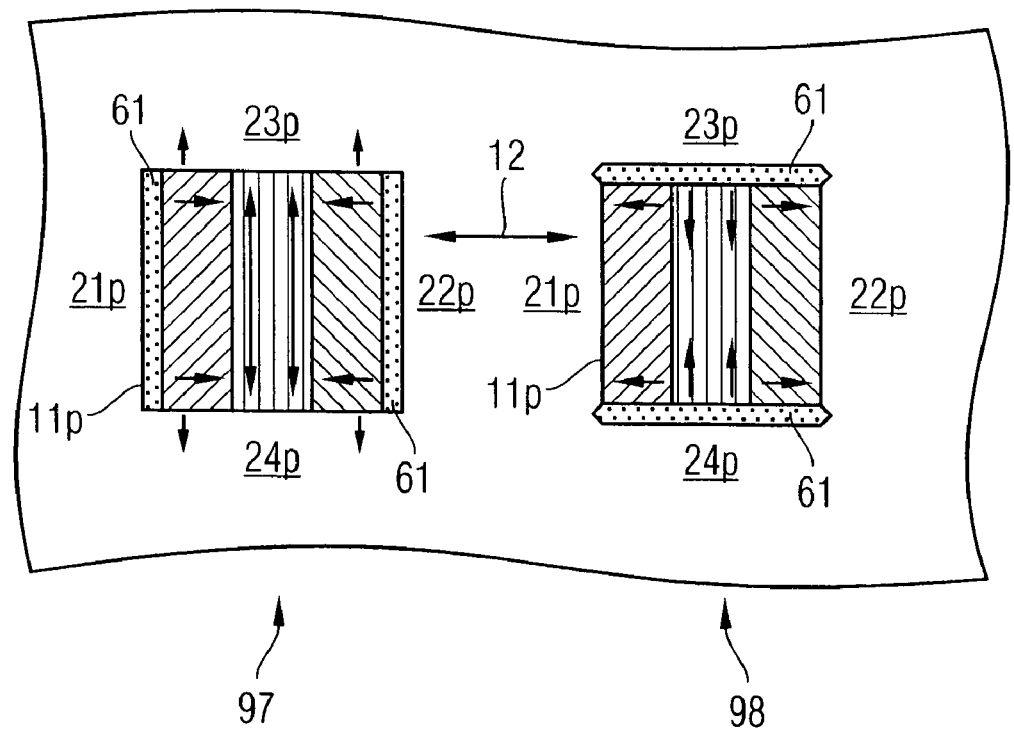
FIG. 10: shows a plan view of a transistor arrangement having two different p-type FETs according to another exemplary embodiment of the invention.

Similarly, the left-hand image half in FIG. 10 represents a first p-type FET 97 with a reduced drain/source resistance and the right-hand image half represents a second p-type FET 98 with a reduced leakage current.

The transistor structures specified in FIG. 9 and FIG. 10 may be combined together in all variants on a common semiconductor substrate.

Figure 11:
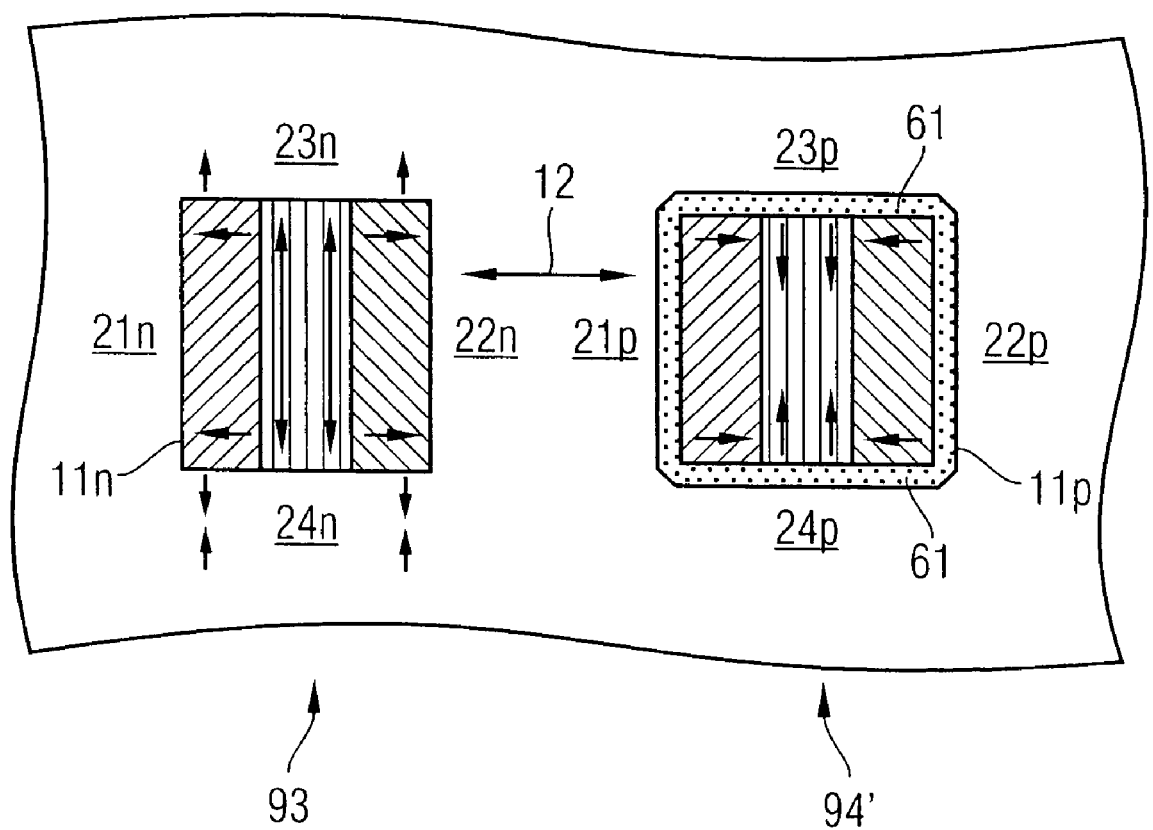
FIG. 11: shows a plan view of a transistor arrangement having a p-type FET and an n-type FET according to another exemplary embodiment of the invention.

FIG. 11 shows an n-type FET 93 stressed in tension along and transversely to the channel axis 12, similarly as in FIG. 7C, in the left-hand image half and a p-type FET 94' compressively stressed along and transversely to the channel axis 12 in the right-hand image half. A mask needed for producing such a transistor arrangement is simpler to generate and align than, for instance, the mask 72 of FIG. 7B. The transistor arrangement of FIG. 11 is, in particular but not exclusively, advantageous for an orientation of the channel axis 12 parallel to the <100> crystal axis, with which the mobility of holes is not impeded by a compressive stress along the channel axis 12, or is impeded only to a minor extent, and is increased by a compressive stress transverse to the channel axis 12.

LIST OF REFERENCES 1 substrate
10 structure surface
11p active area
11n active area
111p source region
111n source region
112p channel region
112n source region
113p drain region
113n source region
12 channel axis
12p p-channel axis
12n n-channel axis
2 trench
20 interface
21 stress control structure
21p insulator structure
21n insulator structure
211 base section
22p insulator structure
22n insulator structure
23p insulator structure
23n insulator structure
24p insulator structure
24n insulator structure
3 substrate part
4 oxide layer
5 trench filler
61 buffer layer
71 mask
72 mask
81 edge
82 edge
83 edge
84 edge
91 n-type FET
92 p-type FET
93 n-type FET
94 p-type FET
94' p-type FET
95 n-type FET
96 n-type FET
97 p-type FET
98 p-type FET The invention claims is:

1. An integrated circuit including a field effect transistor structure comprising:
   an active area formed by a section of a monocrystalline semiconductor substrate, the active area comprising a channel region between a source region and a drain region; wherein, in a conducting state of the field effect transistor structure, a drain current flows essentially in a direction of a channel axis and parallel to a structure surface of the semiconductor substrate;
   a first and second insulator structures each positioned adjacent the active area along interfaces between the active area and the respective insulator structure on opposite sides of the active area; and
   a third and fourth insulator structures positioned adjacent the active area on opposite sides of the active area, the third and fourth insulator structures delimiting the active area transversally relative to the first and second insulator structures;

wherein each of the first and second insulator structures includes a base section substantially free from compressive stress and comprising at least one dielectric material, wherein at least one of the first and second insulator structures includes a buffer layer formed between the base section and the active area, the buffer layer exerting a compressive stress on the active area; and wherein each of the third and fourth insulator structures includes a base section substantially free from compressive stress and comprising at least one dielectric material, and is mechanically unstressed or is configured to exert a tensile stress on the active area.

2. The integrated circuit as claimed in claim 1, wherein the interfaces incline at least about 45 degrees relative to a structure surface of the semiconductor substrate, wherein the structure surface is parallel to the channel axis.

3. The integrated circuit as claimed in claim 1, wherein the base section of each insulator structure comprises a deposited and compacted trench filler, the trench filler comprising a polysilazane-based trench filler.

4. The integrated circuit as claimed in claim 3, wherein the buffer layer has an etching resistance to a conventional etchant that is different than that of the deposited and compacted trench filler of the base section.

5. The integrated circuit as claimed in claim 4, wherein:
the channel axis is oriented parallel to a <110> crystal axis of the semiconductor substrate;
the first and second insulator structures delimit the active area in extension of the channel axis; and
the buffer layers of the third and fourth insulator structure are at least 50% thinner than the buffer layers of the first and second insulator structures.

6. The integrated circuit as claimed in claim 5, wherein a lattice constant of the semiconductor substrate in the active area along the channel axis is at least locally reduced compared with a lattice constant of the active area transverse to the channel axis.

7. The integrated circuit as claimed in claim 1, wherein the source region and the drain region are p-doped.

8. An integrated circuit including a transistor arrangement comprising:
an n-type FET comprising an active area formed by a section of a monocrystalline semiconductor substrate, the n-type FET including a channel region between a source region and a drain region; wherein, in a conducting state of the n-type FET, a drain current flows through the channel region between the source region and the drain region of the n-type FET in the direction of an n-channel axis and parallel to a structure surface of the semiconductor substrate;
an n-type FET insulator structure positioned adjacent the active area of the n-type FET along an interface of the n-type FET, the interface of the n-type FET oriented orthogonally to the n-channel axis;
a p-type FET comprising an active area formed by another section of the monocrystalline semiconductor substrate, the p-type FET including a channel region between a source region and a drain region; wherein, in a conducting state of the p-type FET, a drain current flows through the channel region between the source region and the drain region of the p-type FET in the direction of a p-channel axis and parallel to the structure surface of the semiconductor substrate; and
a p-type FET insulator structure positioned adjacent the active area of the p-type FET along an interface of the p-type FET, the interface of the p-type FET oriented orthogonally to the p-channel axis and inclining at least 30 degrees relative to the structure surface;
wherein the n-type FET insulator structure exerts a tensile stress on the active area of the n-type FET parallel to the n-channel axis;
wherein the p-type FET insulator structure exerts a compressive stress on the active area of the p-type FET parallel to the p-channel axis;
wherein a lattice constant of the semiconductor substrate in the active area of the p-type FET along the p-channel axis is less than a lattice constant of the semiconductor substrate in the active area of the n-type FET along the n-channel axis;
wherein the n-type FET insulator structure and the p-type FET insulator structure each includes a compressive stress-free base section formed of a deposited and compacted trench filler; and
wherein the p-type FET insulator structure includes a buffer layer formed along the interface of the p-type FET.

9. The integrated circuit as claimed in claim 8, wherein the trench filler is a polysilazane-based trench filler.

10. The integrated circuit as claimed in claim 8, wherein the buffer layer includes an etching resistance to a conventional etchant, the etching resistance of the buffer layer being different than an etching resistance of the base section of the p-type FET insulator structure.

11. An integrated circuit including a transistor arrangement comprising:
a first n-type FET and a second n-type FET, the first and second n-type FET each comprising an active area formed by a section of a monocrystalline semiconductor substrate and at least one insulator structure adjacent the active area;
wherein the at least one insulator structure of the first n-type FET are stressed in tension;
wherein the at least one insulator structure of the second n-type FET are compressively stressed;
wherein the insulator structures each include a compressive stress-free base section formed of a deposited and compacted trench filler; and
wherein the at least one insulator structure of the second n-type FET includes a buffer layer formed along the interface of the second n-type FET.

12. An integrated circuit including a transistor arrangement comprising:
a first p-type FET and a second p-type FET, each comprising: an active area formed by a section of a monocrystalline semiconductor substrate, a first set of at least one insulator structure positioned adjacent the active area along a channel axis, and a second set of at least one insulator structure positioned adjacent the active area orthogonal to the channel axis;
wherein the first set of insulator structures of the first p-type FET and the second set of insulator structures of the second p-type FET are stressed in tension;
wherein the second set of insulator structures of the first p-type FET and the first set of insulator structures of the second p-type FET are compressively stressed;
wherein the first and second set of insulator structures of the first and second type p FET each include a compressive stress-free base section formed of a deposited and compacted trench filler; and
wherein the second set of insulator structures of the first p-type FET and the first set of insulator structures of the second p-type FET include a buffer layer formed along the interface of the p-type FET.

* * * * *

UNITED STATES PATENT AND TRADEMARK OFFICE
CERTIFICATE OF CORRECTION

PATENT NO. : 7,385,256 B2 Page 1 of 1
APPLICATION NO. : 11/131938
DATED : June 10, 2008
INVENTOR(S) : Birner et al.

It is certified that error appears in the above-identified patent and that said Letters Patent is hereby corrected as shown below:

On the Title page under Item (73) Assignee:

replace "Infineont Technologies AG, Munich (DE)" with --Infineon Technologies AG, Munich (DE)--

Signed and Sealed this

Eighth Day of September, 2009

David J. Kappos
*Director of the United States Patent and Trademark Office*